United States Patent
Cheng

(10) Patent No.: US 8,104,730 B2
(45) Date of Patent: Jan. 31, 2012

(54) RAIL ASSEMBLY FOR AN INDUSTRIAL COMPUTER

(75) Inventor: Chi-Tsun Cheng, Taipei County (TW)

(73) Assignee: Lif J.K. Corporation, New Taipei (TW)

( * ) Notice: Subject to any disclaimer, the term of this patent is extended or adjusted under 35 U.S.C. 154(b) by 423 days.

(21) Appl. No.: 12/197,311

(22) Filed: Aug. 25, 2008

(65) Prior Publication Data

US 2010/0046161 A1    Feb. 25, 2010

(51) Int. Cl.
*A47F 5/00* (2006.01)

(52) U.S. Cl. ............... 248/298.1; 312/334.1; 312/333; 312/334.44

(58) Field of Classification Search ............ 312/232.2, 312/334.44, 334.46, 330.1, 333, 334.1, 334.4, 312/334.7, 334.8; 361/679.09, 679.08, 679.55; 384/19; 248/298.1

See application file for complete search history.

(56) References Cited

U.S. PATENT DOCUMENTS

| | | | | |
|---|---|---|---|---|
| 4,469,384 A * | 9/1984 | Fler et al. | | 312/333 |
| 5,725,324 A * | 3/1998 | Pavelski | | 403/321 |
| 5,951,132 A * | 9/1999 | Cirocco | | 312/334.46 |
| 6,142,590 A * | 11/2000 | Harwell | | 312/223.1 |
| 6,254,210 B1 * | 7/2001 | Parvin | | 312/334.46 |
| 6,350,001 B1 * | 2/2002 | Chu | | 312/334.44 |
| 6,655,763 B2 * | 12/2003 | Judge et al. | | 312/334.46 |
| 6,715,851 B1 * | 4/2004 | Yang | | 312/334.46 |
| 6,729,703 B2 * | 5/2004 | Le | | 312/333 |
| 6,807,054 B1 * | 10/2004 | Waller et al. | | 361/679.09 |
| 6,909,610 B2 * | 6/2005 | Cheng | | 361/727 |
| 6,984,008 B2 * | 1/2006 | Milligan | | 312/333 |
| 7,187,554 B2 * | 3/2007 | Seki et al. | | 361/727 |
| 7,240,977 B2 * | 7/2007 | He | | 312/333 |
| 7,517,030 B2 * | 4/2009 | Cheng | | 312/334.1 |
| 7,753,460 B2 * | 7/2010 | Peng et al. | | 312/334.46 |
| 8,002,470 B2 * | 8/2011 | Cheng | | 384/19 |
| 2002/0089274 A1 * | 7/2002 | Liang et al. | | 312/334.44 |
| 2002/0117948 A1 * | 8/2002 | Le | | 312/333 |
| 2004/0240185 A1 * | 12/2004 | Cheng | | 361/727 |
| 2007/0001562 A1 * | 1/2007 | Park | | 312/333 |
| 2007/0284981 A1 * | 12/2007 | Cheng | | 312/334.1 |
| 2007/0296318 A1 * | 12/2007 | Peng et al. | | 312/334.44 |
| 2009/0001864 A1 * | 1/2009 | Huang et al. | | 312/333 |
| 2010/0007255 A1 * | 1/2010 | Cheng | | 312/334.44 |
| 2010/0046863 A1 * | 2/2010 | Cheng | | 384/19 |

* cited by examiner

*Primary Examiner* — Terrell McKinnon
*Assistant Examiner* — Daniel J Breslin

(57) ABSTRACT

A rail assembly of an industrial computer is arranged symmetrically to a machine frame. Each side of the rail structure includes two sets of rail and rail base within a height of 1U (4.45 cm). Each rail is formed in one piece with better mechanical strength and load ability. Each rail is arranged to a rail base. Through a protruded surface, a computer, disk driver, keyboard can be fixed and arranged to the rail base. The contact surfaces of the rails to the rail bases are formed as cambered surfaces. The two sets of rail can be arranged to the interfaces needed.

4 Claims, 4 Drawing Sheets

RAIL ASSEMBLY FOR AN INDUSTRIAL COMPUTER

FIELD OF THE PRESENT INVENTION

The present invention relates to rails, and in particular to a rail assembly for an industrial computer which is installed to a machine frame by two sets of rail and rail base within a height of 1 U (4.45 cm) at each side. The rail structure also provides better firmness and sliding effect.

DESCRIPTION OF THE PRIOR ART

A lot of designs of sliding rail and rail set are provided in the market nowadays. A prior art of simple drawable function as a normal drawer provided to users in the beginning is not adaptable to a larger machine casing in industry. Therefore, various designs with special functions are developed.

For example, a rail assembly is disclosed by the inventions of the present inventor. A rail is arranged to a rail base and the contact surface of the rail to the rail base has a ball groove which receives a plurality of rolling balls. The rolling balls will contact to the rail base and will not escape from the groove. When the rail is arranged to the rail base, the rolling balls will roll inside the ball groove by it's covering so that the rail will slide along the rail base. It was a good design before, but the structure is complicated and the cost is high. Moreover, if user applies too much power to push of pull the rail, and because of the rolling balls, device might be moved too fast and be impacted. For a computer, access unit, or precision electronic product, the issue should be avoided.

SUMMARY OF THE INVENTION

Accordingly, the primary object of the present invention is to install two sets of rail and rail base to an industrial computer within a height of 1 U (4.45 cm) at each side.

The secondary object of the present invention is the contact surfaces of the rails to the rail bases being formed as cambered surfaces so that the present invention provides a smooth and power-saving operation of pushing and drawing.

Another object of the present invention is to provide a buckling sheet arranged to the rail base which serves to prevent the device fixed to the rails being pushed back to the frame while operating.

One another object of the present invention is to simply the structure and installation than a prior art so as to save time and cost.

The technique of the present invention is described in the following:

A rail assembly of an industrial computer is arranged symmetrically to a machine frame. Each side of the rail structure includes two sets of rail and rail base within a height of 1 U (4.45 cm). Each rail is formed in one piece with better mechanical strength and load ability. Each rail is arranged to a rail base. Through a protruded surface, a computer, disk driver, keyboard can be fixed and arranged to the rail base. The contact surfaces of the rails to the rail bases are formed as cambered surfaces. The two sets of rail can be arranged to the interfaces needed.

At least one of the rail sets has guiding groove for buckling to a buckling sheet which is installed at a rail base so as to operate the computer device arranged on the rail precisely. Two rails are installed to a frame within a height of 1 U for fixing devices and providing best firmness and sliding effect.

A preferable embodiment of the present invention with illustrations and a description will be provided in the following in details.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
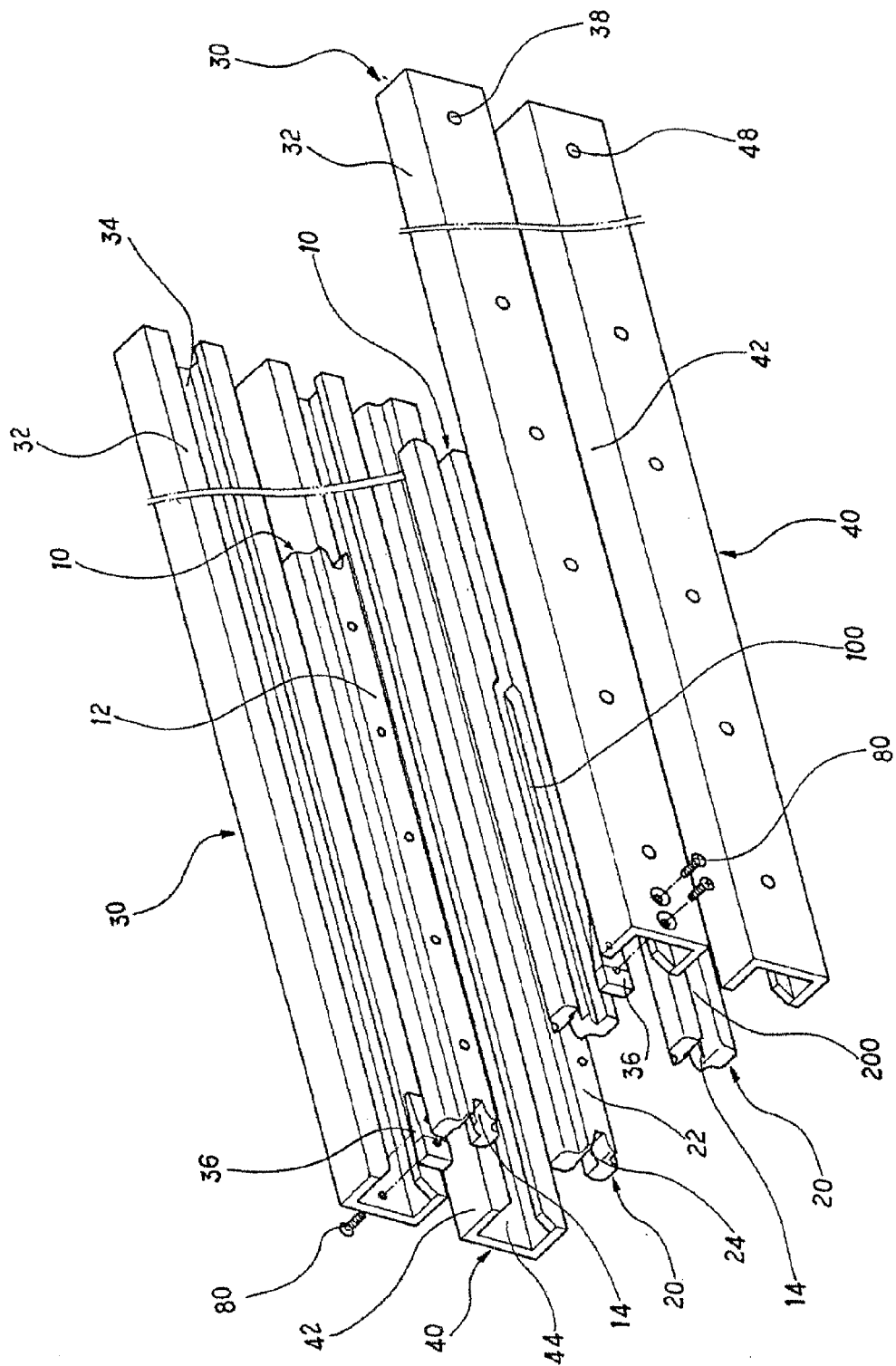
FIG. 1 is an exploded view of a preferable embodiment of the present invention.
Figure 2:
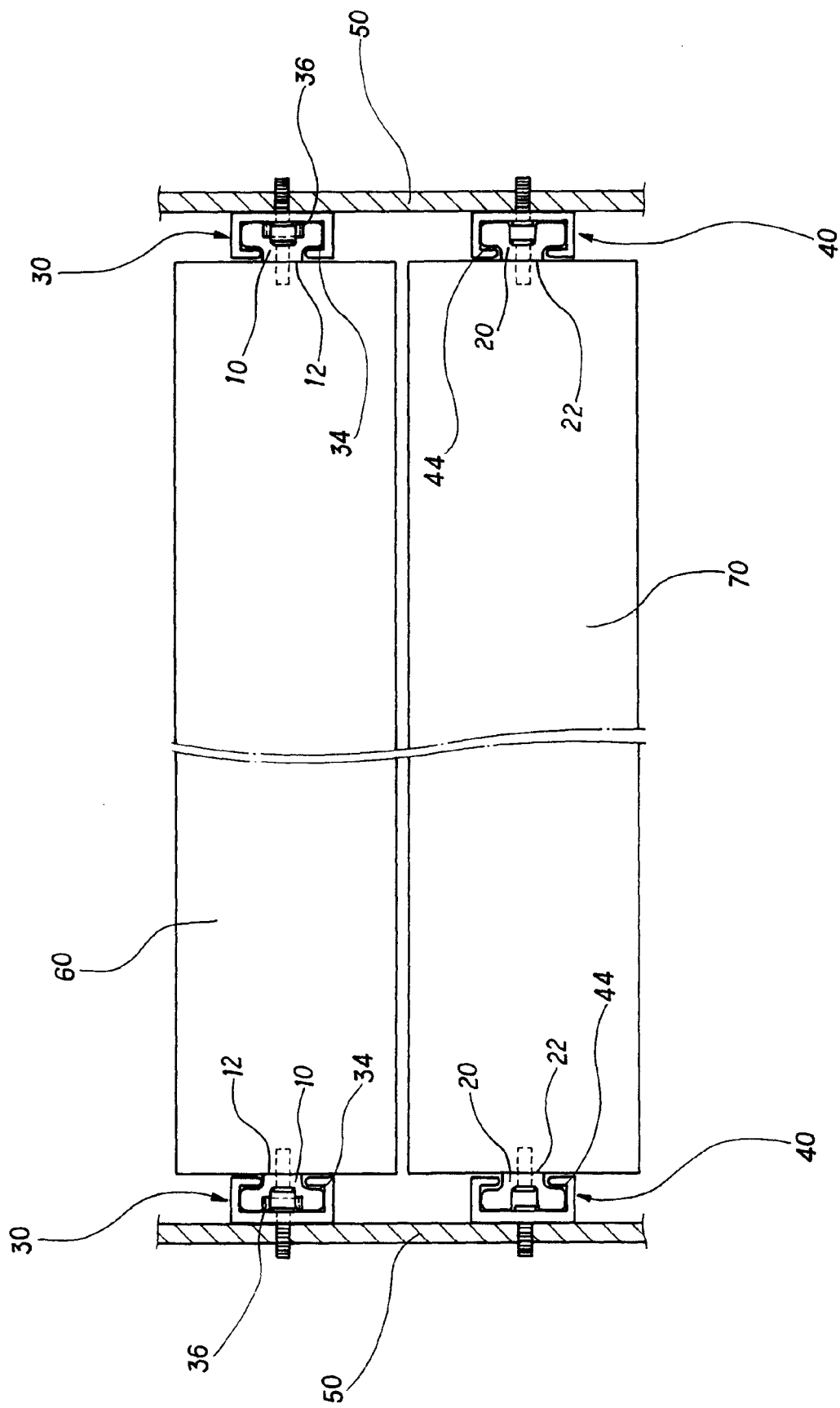
FIG. 2 is a cross section view showing the present invention being installed to a machine frame.
Figure 3:
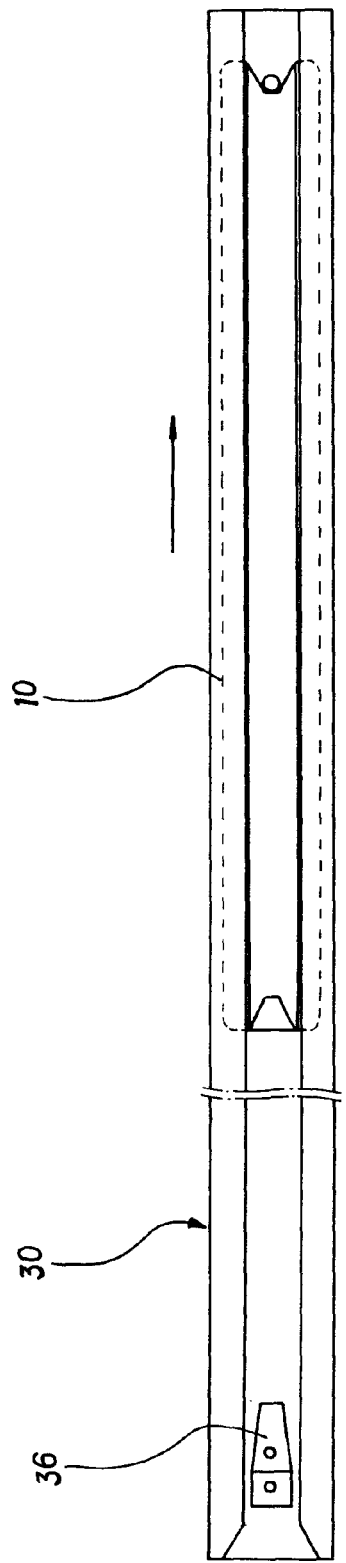
FIG. 3 is a schematic view showing a rail being received by a rail base of the present invention.

Referring to FIGS. 1 and 3, a rail assembly according to the present invention is illustrated. Rail bases 30 and 40 are installed parallel at one side of a machine frame 50 through via holes 38 and 48 so that a device fixed to the rails 10 and 20 is slidable along the rail bases. In a device with a height of 1 U (4.45 cm), two sets of rails 10, 20 and rail bases 30, 40 can be installed at each side of the device. The rail bases 30 and 40 are fixed to the machine frame 50, each of the longitudinal side of the rail bases 30 and 40 are bent as bending portions 32 and 42 so as to from sliding grooves 34 and 44. The rails 10 and 20 can be slideably inserted into the sliding grooves 34 and 44 from the front openings thereof so that the rails 10 and 20 can be arranged to the rail bases 30 and 40 respectively. The sides fixed to a computer, a disk drive, or a keyboard of the rails 10 and 20 are formed as protruded surfaces 12 and 22. As mentioned before, the rails 10 and 20 are arranged into the sliding grooves 34 and 44 formed on the rail bases 30 and 40. Furthermore, the contact surfaces of the rails to the rail bases are formed as cambered surfaces so that the present invention provides a smooth and power-saving operation of pushing and drawing. The rail base 30 can be installed by a buckling sheet 36 through a fixing screw 80 which will be described in the following.

In the embodiment, each of the front and the rear ends of the rails 10 and 20 are formed as concave openings 14 and 24 with guiding function. On the opposite side of the protruded surface 12, the rail 10 is formed with a guiding groove 100 which is shorter than the rail base 10. The rail 20 also has a guiding groove 200 as the guiding groove 100 of the rail 10. For the rail 10, the guiding function of the concave opening 14 means the rail 10 can slide through the buckling sheet 36 from the concave opening 14 and further slide out from the rail base 30 until the end of the guiding groove 100 being stopped by the buckling sheet 36.

Figure 4:
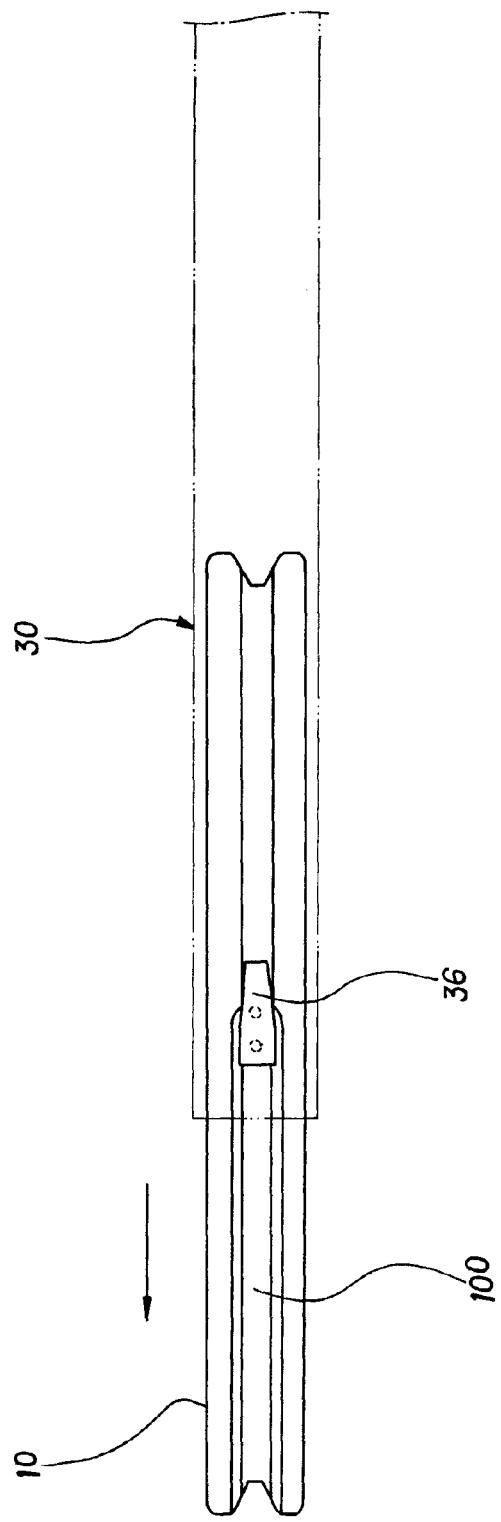
FIG. 4 is a schematic view showing the rail being pulled out from the rail base of the present invention.

With reference to FIGS. 3 and 4, the buckling sheet 36 has an inclined surface and is located at an end of the rail base 30 which the rail 30 slides out from. When the rail 10 is pulled out from the rail base 30, the buckling sheet 36 will buckle to the end of the guiding groove 100 so as to prevent the rail from escaping from the rail base 30. Because of the inclined surface of the buckling sheet 36, the buckling effect is good and it is easy to push the rail away from buckling sheet 36 and back to the rail base. FIG. 3 shows the rail 10 being slideably arranged to the sliding groove 34 of the rail base 30 and not being pulled out. While FIG. 4 shows the rail 10 being pulled out from the rail base 30 and the end of the guiding groove 100 of the rail 10 being buckled to the buckling sheet 36. The buckling sheet 36 can be arranged in accordance with the length of the rail 10.

Figure 5:
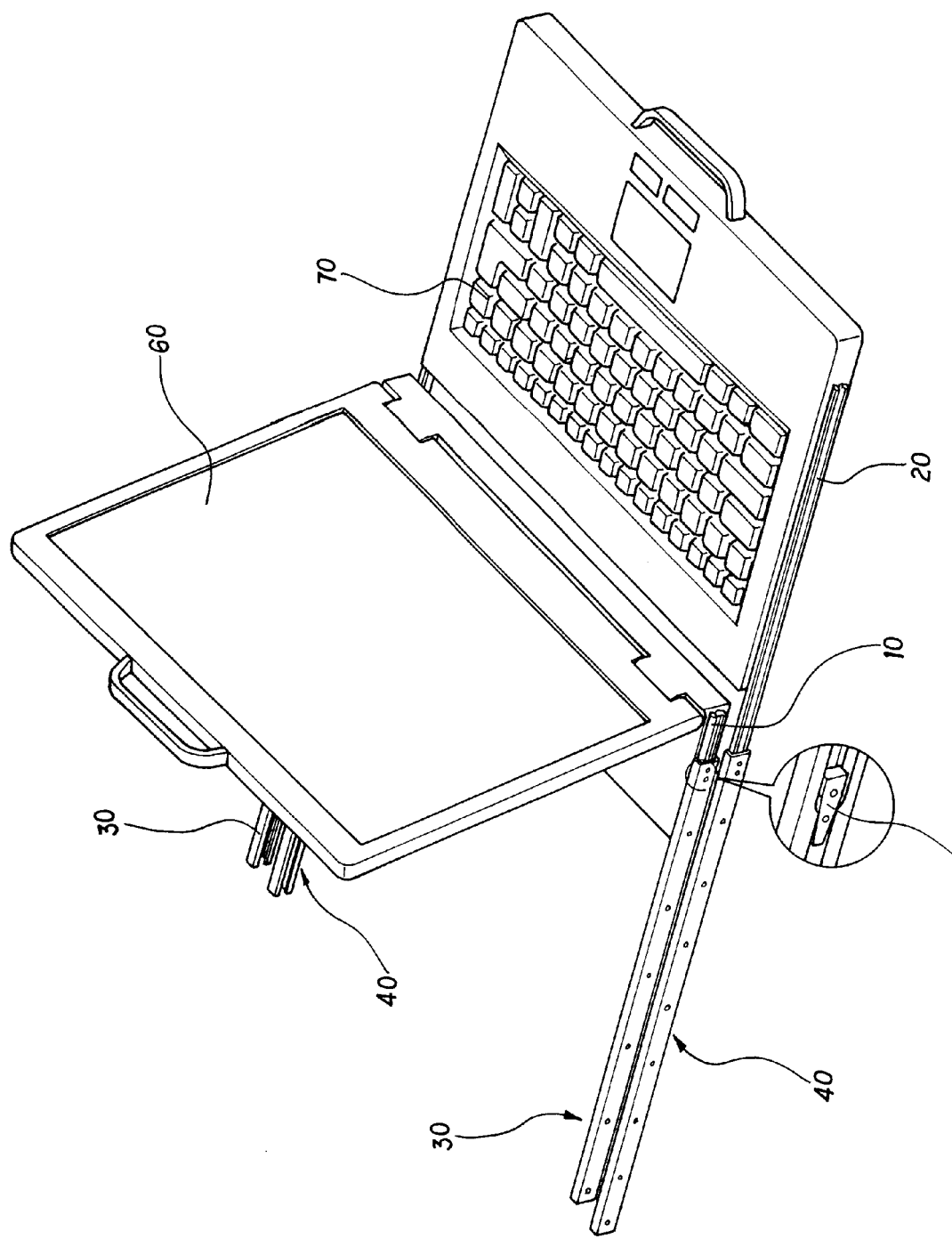
FIG. 5 is a schematic view of an embodiment of the present invention.

With reference to FIG. 5, the two sets of the rails 10, 20 and the rail bases 30, 40 arranged within a height of 1 U (4.45 cm) at each side are illustrated. The upper rail 10 is fixed to a Liquid Crystal Display (LCD) 60, and the lower rail 20 is fixed to a keyboard 70. When the LCD 60 is pulled out, the rail 10 is positioned by the buckling sheet 36 in a predetermined distance. The positioning function will prevent the trouble of a prior rail structure that the LCD 60 being pushed back when flipping the LCD 60.

Besides, the two sets of rail can be arranged to the interfaces needed. In a height of 1 U (4.45 cm), the LCD 60 arranged to the upper rail set can be pulled out alone for data observing, and the lower rail set can be pulled out also to be operated so as to provide convenience and efficiency.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A rail assembly for an industrial computer, the rail assembly comprising:
    a rail having a longitudinal protruded surface thereon and a longitudinal guiding groove therein, wherein the guiding groove has a concave opening and a tapered inner end functioning as a substantial terminal, an effective length of the guiding groove is defined between the concave opening and the tapered inner end, and the effective length is shorter than the rail but not shorter than a half of the rail in length;
    a rail base having a C-shaped cross-section and a sliding groove formed therein for slidably accommodating the rail, wherein the rail is in direct contact with the sliding groove; and
    a stop sheet, attached to an end of the rail base and embedded in the guiding groove, wherein when the rail is slid outwards from the rail base, the tapered inner end of the guiding groove is restricted by the stop sheet to stop the rail.

2. The rail assembly as claimed in claim 1, wherein a front end and a rear end of the rail has a concave opening with the function of guiding.

3. The rail assembly as claimed in claim 1, wherein the contact surfaces of the rails to the rail bases are formed as cambered surfaces so as to provide a smooth and power-saving operation of pushing and pulling.

4. The rail assembly as claimed in claim 1, wherein the stop sheet has a wedged shape.

* * * * *